United States Patent
Bhatia et al.

(10) Patent No.: US 10,748,797 B2
(45) Date of Patent: Aug. 18, 2020

(54) PLASMA PARAMETERS AND SKEW CHARACTERIZATION BY HIGH SPEED IMAGING

(71) Applicant: Applied Materials, Inc., Santa Clara, CA (US)

(72) Inventors: Sidharth Bhatia, Santa Cruz, CA (US); Edward P. Hammond, IV, Hillsborough, CA (US); Bhaskar Kumar, Santa Clara, CA (US); Anup Kumar Singh, Santa Clara, CA (US); Vivek Bharat Shah, Sunnyvale, CA (US); Ganesh Balasubramanian, Sunnyvale, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 24 days.

(21) Appl. No.: 15/873,971

(22) Filed: Jan. 18, 2018

(65) Prior Publication Data
US 2018/0204750 A1    Jul. 19, 2018

Related U.S. Application Data

(60) Provisional application No. 62/447,746, filed on Jan. 18, 2017.

(51) Int. Cl.
*H01L 21/67* (2006.01)
*H01L 21/3065* (2006.01)
*G06T 7/00* (2017.01)
*H01J 37/32* (2006.01)

(52) U.S. Cl.
CPC ...... *H01L 21/67253* (2013.01); *G06T 7/0004* (2013.01); *H01J 37/32981* (2013.01); *H01L 21/3065* (2013.01); *H01J 37/321* (2013.01); *H01J 2237/334* (2013.01)

(58) Field of Classification Search
CPC .......... H01L 21/67253; H01L 21/3065; H01L 22/26; H01J 37/32981; H01J 37/32963; H01J 2237/334
USPC ............................................. 216/59, 60, 67
See application file for complete search history.

(56) References Cited

U.S. PATENT DOCUMENTS

| | | |
|---|---|---|
| 5,180,921 A | 1/1993 | Moreau et al. |
| 5,576,629 A | 11/1996 | Turner et al. |
| 6,077,386 A | 6/2000 | Smith, Jr. et al. |
| 6,090,302 A | 7/2000 | Smith, Jr. et al. |
| 6,123,983 A | 9/2000 | Smith, Jr. et al. |
| 6,261,470 B1 | 7/2001 | Smith, Jr. et al. |
| 6,383,402 B1 | 5/2002 | Smith, Jr. et al. |
| 2001/0014520 A1 | 8/2001 | Usui et al. |

(Continued)

FOREIGN PATENT DOCUMENTS

WO    WO-2016046886 A1 *  3/2016   ............. C23C 14/34

OTHER PUBLICATIONS

Wikipedia, The Free Encyclopedia; "Electric Arc" via https://en.wikipedia.org/wiki/Electric_arc ; pp. 1-7; 2020.*

*Primary Examiner* — Binh X Tran
(74) *Attorney, Agent, or Firm* — Patterson + Sheridan, LLP (57) ABSTRACT

Embodiments of the present disclosure relate to a method and an apparatus for monitoring plasma behavior inside a plasma processing chamber. In one example, a method for monitoring plasma behavior includes acquiring at least one image of a plasma, and determining a plasma parameter based on the at least one image.

10 Claims, 5 Drawing Sheets

(56) References Cited

U.S. PATENT DOCUMENTS

| | | | |
|---|---|---|---|
| 2005/0194094 A1 | 9/2005 | Yasaka | |
| 2006/0196858 A1* | 9/2006 | Barron | A44C 17/00 219/121.69 |
| 2011/0132871 A1* | 6/2011 | White | G01B 11/16 216/52 |
| 2017/0040144 A1* | 2/2017 | Popovic | H01J 37/32192 |
| 2017/0062186 A1* | 3/2017 | Coumou | H01J 37/32155 |
| 2017/0067779 A1* | 3/2017 | Kim | G01J 3/0208 |
| 2017/0133202 A1* | 5/2017 | Berry, III | H01J 37/3222 |
| 2017/0140905 A1* | 5/2017 | Mihaylov | H01J 37/32944 |
| 2018/0298488 A1* | 10/2018 | Sakata | C23C 14/34 |

* cited by examiner

PLASMA PARAMETERS AND SKEW CHARACTERIZATION BY HIGH SPEED IMAGING

CROSS-REFERENCE TO RELATED APPLICATIONS

This applications claims benefit of U.S. Provisional Patent Application Ser. No. 62/447,746, filed on Jan. 18, 2017, which is herein incorporated by reference in its entirety.

BACKGROUND

Field

Embodiments of the present disclosure generally relate to methods and apparatus for observing and analyzing plasma behavior inside a plasma processing chamber during plasma processing.

Description of the Related Art

Plasma-enhanced chemical vapor deposition (PECVD) is a chemical process where electro-magnetic energy is applied to at least one precursor gas or vapor to transform the precursor into a reactive plasma. There are many advantages to using PECVD, including but not limited to lowering the temperature required to form a film, increasing the rate of formation of the film, and enhancing the properties of the film being deposited. Particles of the gas or vapor ionized by the plasma diffuse through the plasma sheath and are absorbed onto the substrate to form a thin film layer. Plasma may be generated inside the processing chamber, i.e., in-situ, or in a remote plasma generator that is remotely positioned from the processing chamber. This process is widely used to deposit materials on silicon substrates to produce high-quality and high-performance semiconductor devices.

Particle contamination during plasma processes, such as PECVD, adversely affects the performance of semiconductor devices. Additionally, plasma skew within the processing chamber is also undesirable, as the plasma skew results in processing non-uniformity which contributes to higher defect rates in the semiconductor devices. Therefore, there is a need for improved methods and apparatus for observing and analyzing plasma behavior for plasma processing in order to control uniformity and defects during processing.

SUMMARY

Embodiments of the disclosure generally relate to methods and apparatus for monitoring plasma characteristics in a plasma processing chamber during plasma processing.

In one embodiment, a method for monitoring plasma characteristics in a plasma processing chamber comprising acquiring at least one image of a plasma disposed in a processing chamber; determining a plasma parameter based on the at least one image; and modifying a process condition in response to the determined plasma parameter.

In another embodiment, a method for monitoring plasma characteristics in a plasma processing chamber comprises acquiring at least one image of a plasma disposed in a processing chamber, the acquiring occurring through a first lens placed on an aperture coupled to one of a plurality of gas-passage holes formed on a ring-shaped liner disposed within the processing chamber; determining a plasma parameter based on the at least one image, the process parameter including at least one of plasma sheath thickness or plasma sheath position; and modifying a process condition in response to the determined plasma parameter.

In another embodiment, a plasma processing chamber comprises a chamber body; a pumping liner disposed in the chamber body, the pumping liner having a plurality of gas-passage holes formed therethrough; a viewport formed through the chamber body; a first lens disposed in an aperture aligned with the viewport; and a camera having a lens positioned to obtain images of a plasma formed within the chamber body through the first lens and the viewport.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the disclosure generally relate to methods and apparatus for observing and analyzing plasma behavior and/or characteristics inside a plasma processing chamber during plasma processes, such as plasma enhanced chemical vapor deposition, plasma enhanced atomic layer deposition, etching, plasma annealing, and ion implantation, among other plasma processes. Information regarding the plasma behavior may be advantageously utilized to control film deposition and other aspects of process uniformity, along with controlling defects during production. In one embodiment, a method for monitoring plasma characteristics in a plasma processing chamber includes analyzing one or more images of a plasma disposed in a processing chamber. The images may be utilized to control the distribution of particles within the chamber, controlling plasma skew, and controlling the uniformity of processing results.

Figure 1:
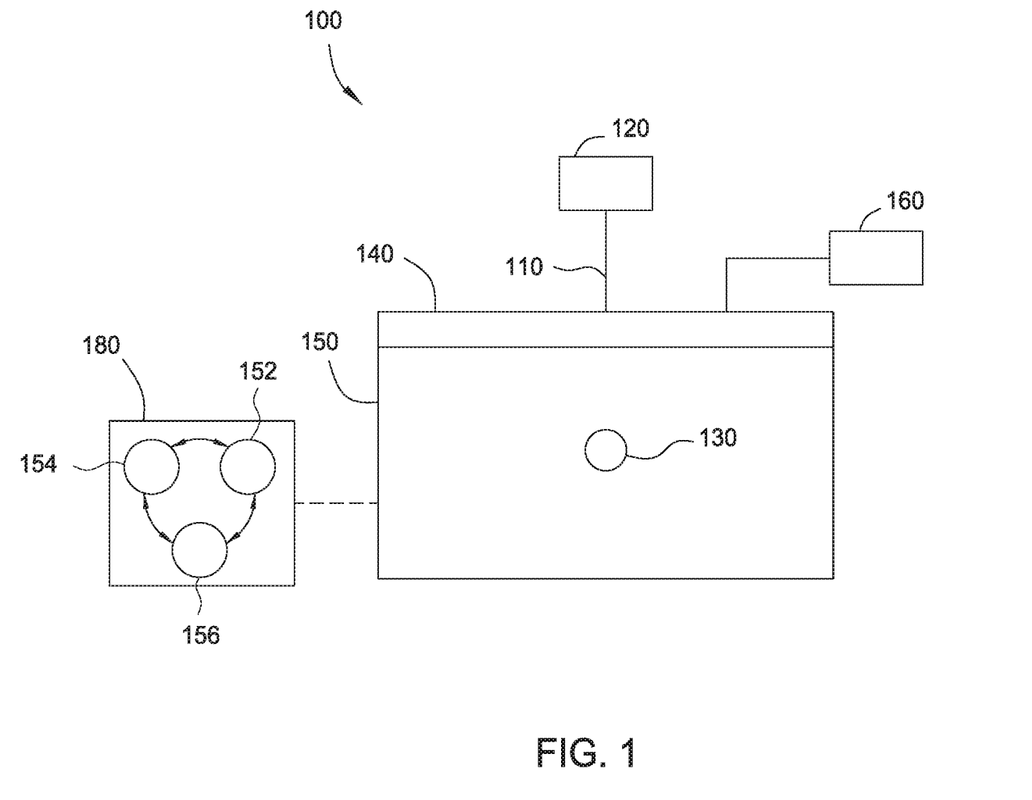
FIG. 1 is an schematic view of a plasma processing chamber, according to one embodiment.

Referring to the drawings, FIG. 1 is a schematic view of a plasma processing chamber 100. The plasma processing chamber 100 is used for plasma-enhanced chemical vapor deposition. The plasma processing chamber 100 may alternatively be configured to perform plasma etching, plasma annealing, and plasma assisted ion implantation, among other plasma processes. In one embodiment, the processing chamber 100 includes a chamber body 150, a chamber lid assembly 140 disposed on the chamber body and coupled with a gas source 120 and, a power source 160. The gas source 120 is coupled to the chamber body 150 via a conduit 110. The gas source 120 provides process gas to an interior volume of the chamber body 150 for processing a substrate disposed within the processing chamber 100. The gas source 120 may optionally provide cleaning gases to the interior of the chamber body 150 for cleaning the interior of the chamber body 150.

The power source 160 is a radio-frequency (RF) power source that couples RF power through a matching circuit (not shown) to the process gases within the chamber body 150 to form a plasma. The power source 160 operates at 13.56 MHz or one or more other suitable frequencies. In one example, the power source 160 is coupled to an electrode disposed within of the chamber body 150 to capacitively couple power to the process gases to generate a capacitively-coupled plasma (CCP). In another example, the power source 160 is coupled to coils disposed outside of the chamber body 150 to inductively couple power to the process gases to generate an inductively-coupled plasma (ICP).

The chamber body 150 also includes a viewport 130. The viewport 130 is configured to allow the plasma to be viewed from the exterior of the chamber body 150. In one example, the viewport 130 is a window fabricated from quartz, sapphire or another process compatible window material.

The processing chamber 100 is connected to a controller 180 that controls the processes performed within the processing chamber 100. The controller 180 includes a central processing unit (CPU) 152, a memory 154, and a support circuit 156 utilized to control the process sequence and regulate the gas flows from the gas source 120 and power applied to the processing chamber 100 from the power source 160. The CPU 152 may be any form of general purpose computer processor that may be used in an industrial setting. The software routines can be stored in the memory 154, such as a random access memory, read only memory, floppy, or hard disk drive, or other form of digital storage. The support circuit 156 is conventionally coupled to the CPU 152 and may include cache, clock circuits, input/output systems, power supplies, and the like. Bi-directional communications between the controller 180 and the various components of the processing chamber 100 are handled through numerous signal cables, not shown.

Figure 2:
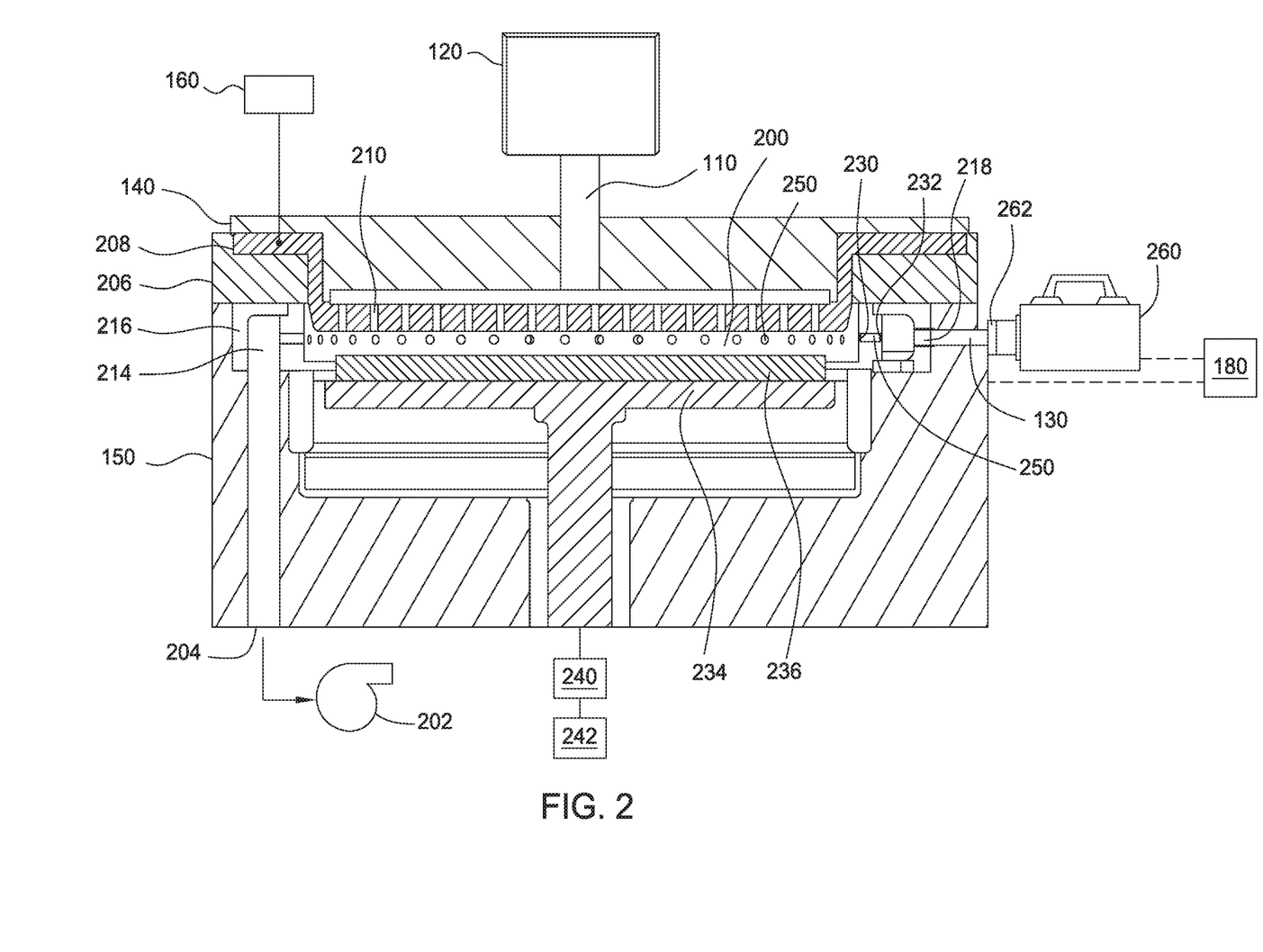
FIG. 2 is a cross-section front view of the plasma processing chamber of FIG. 1.

FIG. 2 shows a cross-section view of the plasma processing chamber 100 of FIG. 1. In the embodiment shown, a substrate support 234 is disposed in the interior volume of the chamber body 150. The substrate support 234 is configured to support a substrate 236 thereon during processing. The substrate support 234 may include an electrode (not shown) embedded therein and coupled to a bias power source 242 via a matching circuit 240. The bias power source 242 provides an electrical bias that generally pulls ions and other species from within a plasma located within the processing chamber 100 towards the substrate 236.

A showerhead 208 is coupled to the lid assembly 140 and is disposed within the chamber body 150 above the substrate support 234. The showerhead 208 is electrically isolated from the chamber body 150 by an isolator 206. The showerhead 208 includes a plurality of gas passage holes 210 formed therein. During operation, a gas from the gas source 120 flows through the conduit 110 and enters the chamber body 150 between the lid assembly 140 and the showerhead 208. The gas then passes through the plurality of gas passage holes 210 to a processing region defined between the showerhead 208 and the top surface of the substrate support 234. The gas in the processing region is energized to a plasma by power applied to the showerhead 208 by the power source 160. In one example, species from the dissociated gas present in the plasma are subsequently deposited on the substrate 236 to form a desired thin film layer. In another example, species from dissociated gas present in the plasma are utilized to etch a layer disposed on the substrate 236. It is contemplated the plasma may be utilized to process the substrate in other manners, such as annealing and ion implanting, among others.

The chamber body 150 includes a ring-shaped pumping channel 214 that is coupled to an exhaust port 204. The exhaust port 204 is coupled to a pumping system 202 to control the pressure within the processing region and to remove processing by-products. The viewport 130 is disposed though the chamber body 150 and is open to the pumping channel 214.

The pumping channel 214 is covered by a channel liner 216 and a pumping liner 200. The channel liner 216 protects the portion of the chamber body 150 exposed to the pumping channel 214. The pumping liner 200 is ring-shaped and separates the pumping channel 214 from the processing region of the chamber body 150. Apertures 250 are formed through the pumping liner 200 to allow gas from the processing region to be drawn into the pumping channel 214 and eventually exhausted out of the chamber body 150 through the exhaust port 204 by the pumping system 202.

An aperture 218 is formed through the channel liner 216 and is aligned with the viewport 130. The aperture 218 additionally aligns with one of the apertures 250 formed through the pumping liner 200 so that the plasma within the processing chamber 100 may be viewed from the exterior of the processing chamber 100 through the viewport 130, aperture 218 and aperture 250.

The aperture 250 of the pumping liner 200 that is aligned with aperture 218 and viewport 130 may include at least one lens positioned therein or coupled thereto. For example, a first lens 230 may be placed within aperture 250. In some embodiments, the lens 230 is a wide-angle lens. The lens 230 has a short focal length and a small diameter to fit into the aperture and collect a wide field of light. As an example, the focal length of the lens 230 may be around 5-6 mm. In some embodiments, a second lens 232 may be placed within the aperture 250. The second lens helps to further collimate the light obtained from the first lens as the light passes through the aperture 218. This lessens the dispersion of the light and allows for a brighter image as the exits the aperture 218. In some embodiments, the second lens 232 has the same focal length and diameter as the first lens 230, though the second lens may have a focal length of up to 30 mm. In some embodiments, a third lens may be added which further collimates the light and allows for greater intensity as the exits the aperture 218.

A camera 260 is coupled to the exterior of the chamber body 150 in a position that allows the camera 260 to capture images within the processing region through the viewport 130, and apertures 218, 250. The camera 260 includes a lens 262 is positioned to interact with and receive light passing through the lenses 230 and 232. The camera 260 is operable to capture images of the plasma disposed within the plasma processing region of the chamber body 150. In one example, the camera 260 captures images at a high-speed, such as, for example, of at least 50,000 frames (i.e., images) per second. The lenses 230 and 232 may have focal length and diameter that are smaller than the focal length and diameter of the lens 262. The focal length of the lens 262 is sufficiently long to expand the smaller images of the plasma created by the first lens 230, without causing scattering or compromising the image intensity. This allows the lens 262 to have minimal aberration and be as efficient as possible to let the maximum amount of light from the plasma into the camera 260 and produce a minimally-distorted image. For example, in one embodiment, each of the lenses 230 and 232 have a diameter of 6 mm and a focal length of 10 mm, while the lens 262 of the camera 260 has a diameter of 12.5 mm and a focal length of 100 mm. Accordingly, the diameter of the aperture 250 may be about 0.25 in to accommodate the lenses 230 and 232. In one example, the camera 260 may be, but is not limited to, a Photron Fastcam SA5 Model No. 775K-M2. The camera 260 is coupled to the controller 180 which can process the images of the plasma obtained by the camera 260 according to one or more of the methods described below.

The images of the plasma are obtained and used to observe and analyze plasma behavior and/or characteristics inside the chamber body 150 during plasma processing of the substrate in the plasma processing chamber 100 as described above—for example, during plasma-enhanced chemical vapor deposition or other plasma processes. In some embodiments, plasma characteristics such as plasma sheath thickness, plasma skew, and plasma termination ordering with respect to chamber location may be observed and analyzed. These characteristics advantageously may be utilized for controlling plasma and processing uniformity, as well as for reducing defects, when processing the substrate 236.

Figure 3:
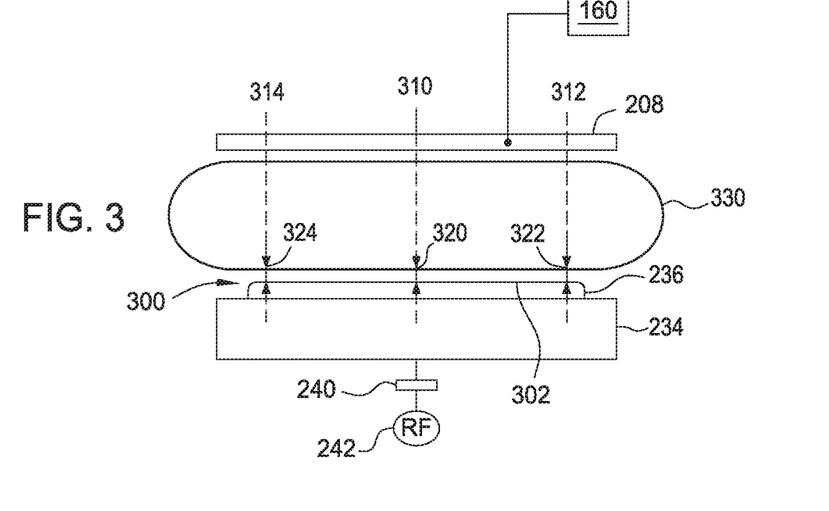
FIG. 3 is a graphical representation of a plasma over a substrate disposed inside the plasma processing chamber of FIG. 1.

FIG. 3 is a graphical representation of a plasma 330 formed over the substrate 236 inside the plasma processing chamber 100 during operation. A region depleted of electrons, e.g., a plasma sheath 300, is present between the plasma 330 and the substrate 236 disposed on the substrate support 234. One or more images of the plasma 330 and/or plasma sheath 300 captured by the camera 260 may be utilized to determine characteristics of the plasma 330. The characteristics of the plasma 330 may then be utilized to tune the plasma processing parameters to improve plasma processing results—for example, improving deposition or etch uniformity, and/or reducing contaminant concentrations or defects on the substrate 236. Example characteristics of the plasma 330 include sheath thickness, plasma intensity, plasma skew, order (center to edge, or edge to center) of plasma termination, particle presence, particle location, and the like.

In one example, images taken by the camera 260 have a field of view that enables the image to include a center region 310 of the plasma 330, and opposite edge regions 312, 314 of the plasma 330. With these regions 310, 312 and 314 in focus, the image is utilized to analyze a distance across the plasma sheath 300 at the center and opposing edges of the plasma 330. For example, a distance 320 across the plasma sheath 300 at the center region 310 may be compared with a distance 322 across the plasma sheath 300 at the edge region 312 or with a distance 324 across the plasma sheath 300 at the edge region 314, to facilitate adjustment of plasma parameters to affect plasma characteristics and/or behavior.

Figure 4:
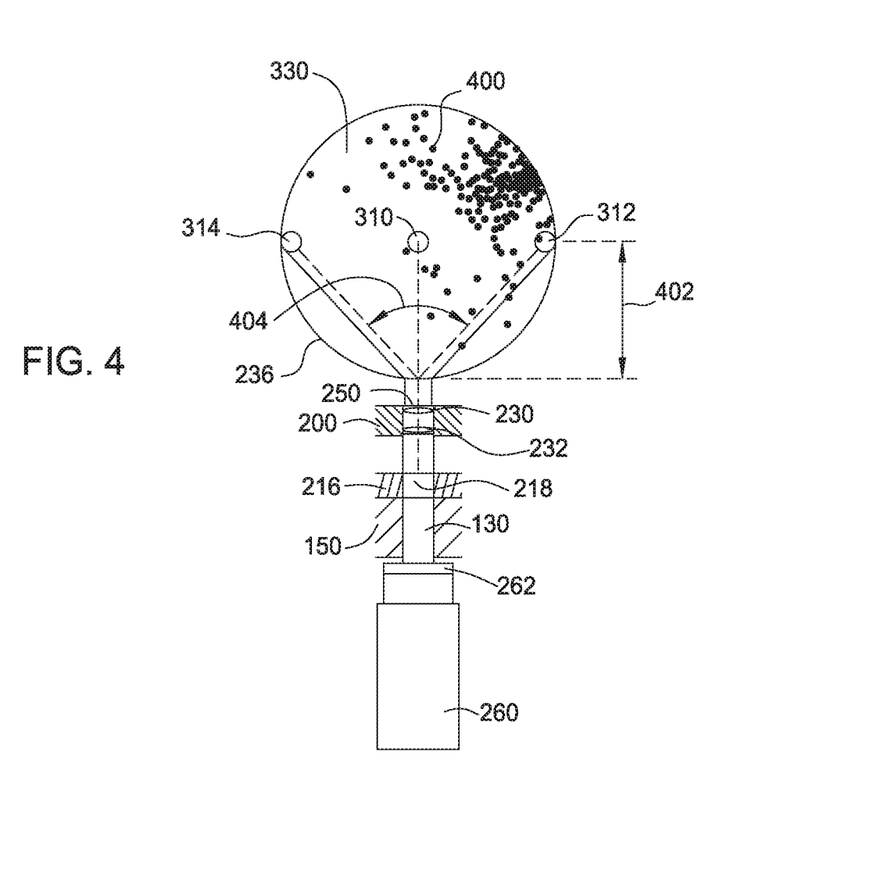
FIG. 4 is a graphical representation of a top view of the plasma over the substrate relative to a position of a high-speed imaging camera.

FIG. 4 is a representation of the top view of the plasma 330 over the substrate 236 showing the relative position of the camera 260. The camera 260, having the lens 262, is positioned to obtain images of the plasma 330 formed within the chamber body 150 through the viewport 130. As discussed above, the aperture 250 is aligned with the aperture 218 and the viewport 130. The first lens 230 is placed within aperture 250. In some embodiments, the first lens 230 is a wide-angle lens that captures images over an angle 404 and a depth of field 402. In one example, the angle 404 of view provided by the first lens 230 is between about 64 and about 84 degrees, however, other angles 404 of view are contemplated. In such an example, the second lens 232 is also disposed in the aperture 250. The second lens 232 has the same focal length and diameter as the first lens 230. The camera 260 is configured to capture images of the plasma 330 within the plasma processing chamber 100 at a high-speed, for example, at least 50,000 frames per second. The images taken by the camera 260 may be focused on the center region 310 of the plasma 330 and edge regions 312, 314 of the plasma 330, for example, at the 3 o'clock position at region 312 and at the 9 o'clock position at region 314.

Figure 5A:
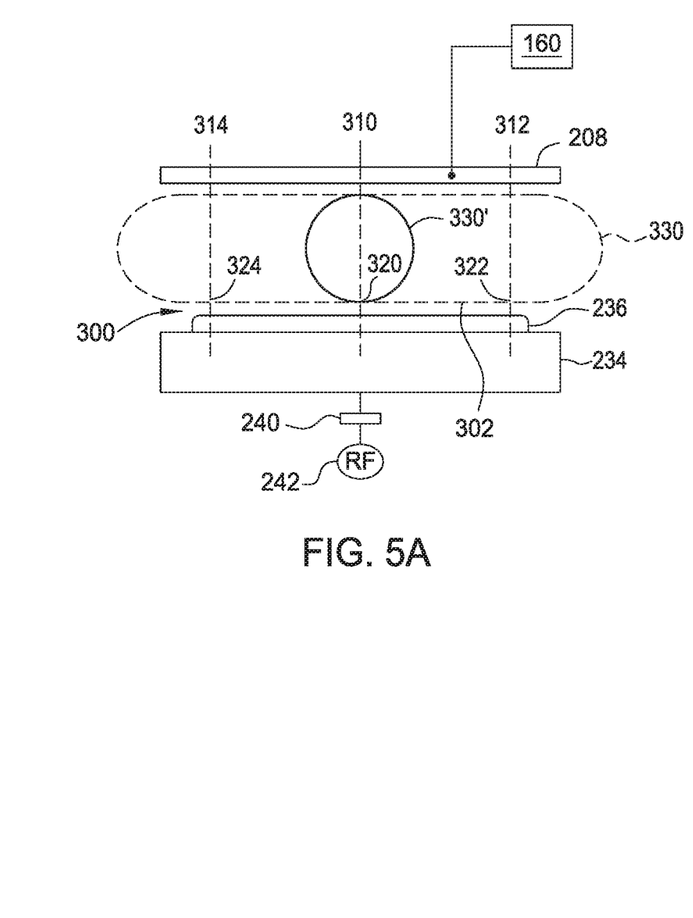
FIGS. 5A and 5B are graphical representations of a plasma disposed over a substrate as the plasma is terminated.

FIG. 5A is a graphical representation of the plasma 330 disposed over the substrate 236 inside the plasma processing chamber 100 as the plasma 330 is extinguished. In the illustration of FIG. 5A, the extent of the plasma 330 during processing is shown in dashed lines. As shown in FIG. 5A, the plasma 330 is extinguished from the edge regions 312 and 314 first, leaving a small area of remaining plasma 330' disposed over the center region 310 just prior to the plasma extinction. As a result, the particles suspended within the remaining plasma 330', and more particularly within the plasma sheath 300 adjacent the remaining plasma 330', are concentrated at the center region 310. The corresponding center region 310 of the substrate 236 undesirably receives an unwanted concentration of particles as the remaining plasma 330' at the center region 310 finally terminates.

Figure 5B:
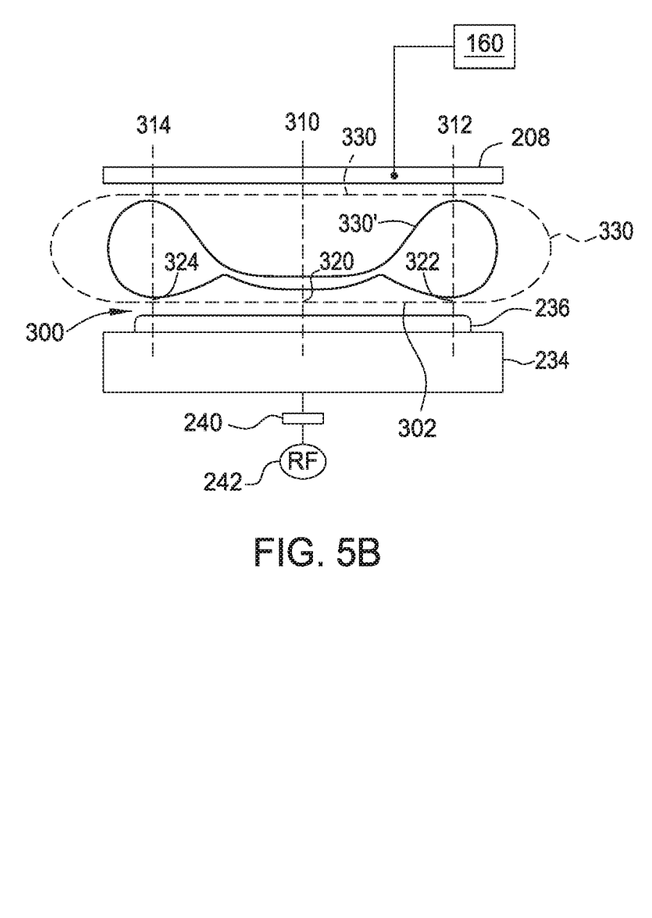

On the other hand, as illustrated by FIG. 5B, the plasma 330 disposed over the substrate 236 may be extinguished in the center region 310 first and collapse. As the plasma 330 is extinguished in the center region 310 first, the plasma 330 leaves behind two small areas of the remaining plasma 330' disposed over the edge regions 312, 314, just prior to the plasma extinction. As a result, particles suspended within the remaining plasma 330', and more particularly within the plasma sheath 300, become concentrated at the edge regions 312 and 314. The corresponding edge regions 312, 314 of the substrate 236 undesirably receives an unwanted concentration of particles as the remaining plasma 330' at the edge regions 312, 314 finally terminates. However, it is to be noted that plasma-extinguishing regime shown in FIG. 5B may position the remaining plasma regions 330' adjacent apertures 250 of the pumping liner 200 (shown in FIG. 2). In such an example, upon extinguishing of the remaining plasma 330', particles are exhausted into the pumping liner 200 rather than contaminating the substrate 236. It is to be noted, however, that chambers other than those described herein may benefit from another plasma-extinguishing regime, based on individual chamber configuration.

Images captured at high-speed while the plasma is extinguished in either case described above is indicative of where the plasma terminates first and last, and therefore indicative of where particles are likely to be concentrated on the substrate. Accordingly, in response to the images, plasma parameters, such as but not limited to power, pressure, gas flow and the like, may be adjusted or tuned to the shape of the plasma 330, or to adjust other plasma characteristics, as the plasma terminates or during plasma processing. Analysis of captured images is useful in determining the order of plasma termination for the purposes of minimizing the formation of defects in the production of the thin film layer on the substrate 236, as well as for facilitating adjustment of other processing parameters.

Figure 6:
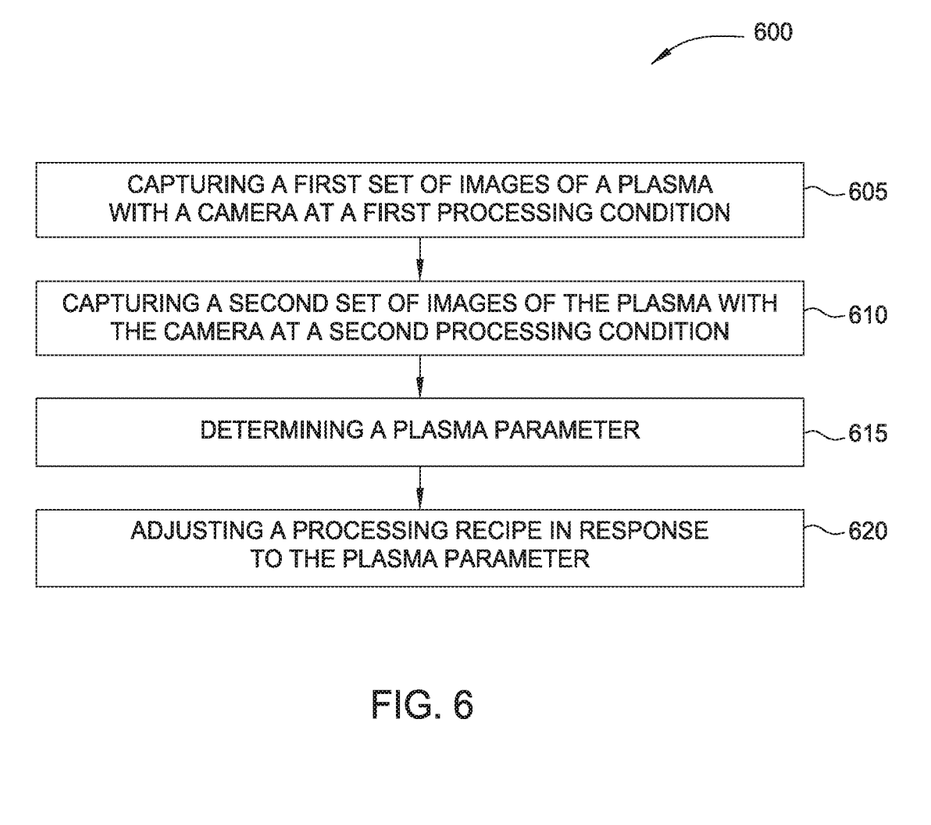
FIG. 6 is a flow diagram of a method of observing and analyzing plasma behavior inside a plasma processing chamber during plasma processing.

FIG. 6 is a flow diagram of a method 600 of monitoring plasma behavior inside a plasma processing chamber, such as but not limited to the processing chamber 100 shown in FIG. 1 and FIG. 2. It is contemplated that the method may be practiced in other plasma processing chambers.

The method 600 begins at block 605 by capturing a first set of images of the plasma 330 with the camera 260. The first set of images includes at least one image. In one example, the first set of images is a single wide-angle view of the plasma sheath 300. In another example, the first set of images is a plurality of images capturing the collapse and termination of the plasma 330. The first set of images is captured while the plasma is at a first processing condition. The first processing condition may be defined by a process recipe that provides at least one of an amount of gas, a gas mixture, a pressure within the processing chamber, power applied for coupling to plasma, bias power, spacing between the substrate and the showerhead, frequency of power applied for coupling to plasma, temperature, or other processing parameter.

At block 610, the camera 260 is utilized to capture a second set of images of the plasma 330. The second set of images includes at least one image or a plurality of images. In one example, the second set of images is a single wide-angle view of the plasma sheath 300. In another example, the second set of images is a plurality of images capturing the collapse and termination of the plasma 330.

The second set of images may be captured while the plasma is at a second processing condition that is different than the first processing condition. The second processing condition may be different than the first processing condition due to a difference between at least one of an amount of gas, a gas mixture, a pressure within the processing chamber, power applied for coupling to plasma, bias power, spacing between the substrate and the showerhead, frequency of power applied for coupling to plasma, or other processing parameter.

At block 615, at least one plasma characteristic is determined using the images captured in at least one of blocks 605, 610 and provided to the controller 180 (shown in FIG. 1) or other processor. For example, the captured set of images (e.g., the first and/or second set of images) may be utilized to compare the thicknesses of the plasma sheath at the center and at the edges of the plasma. In another example, the captured set of images may be utilized to determine an asymmetry of the plasma distribution within the processing chamber. In yet another example, the captured set of images may be utilized to determine the order of plasma termination with respect to the chamber location.

During operation, the electrostatic forces acting on particles are the most dominant (amongst all other forces, such as gravitational, drag, or thermophoretic), which results in suspension of the particles, which are negatively charged, being trapped at the interface of the plasma sheath and plasma bulk, which is positively charged. Therefore, when the plasma having a thicker sheath thickness is extinguished, trapped particles have a higher likelihood of being pumped out due to the pumping induced fluid drag, resulting in less contamination on the substrate.

In addition to the effect on defect control as described above, sheath thickness also determines ion energies, which in turn determines the deposition/etching rates, film properties (e.g., density and surface roughness) and etch directionality and selectivity. In one example, high plasma density sites within a plasma will result in increased gas phase nucleation, which corresponds to sites of more concentration of defects on a substrate. In another example, the intensity of the plasma in the visible wavelength is driven by spacing (between the substrate and the showerhead) and the RF power applied to an electrode coupling to the plasma. Thus, intensity can be tuned using spacing and application of RF power. In such an example, the intensity of the plasma is lower at the edge regions closer to the pumping channel, as illustrated by regions 314 and 324 in FIGS. 3 and 4. It is also found that plasma conditions at higher spacing show longer tail in plasma termination. Longer tail in plasma implies longer plasma transients which in turn could enhance plasma skew related artifacts, such as localized defects, and deposition or etch non-uniformity. Thus, as will be appreciated, capturing images of plasma to determine plasma characteristics, or capturing multiple images for comparison to determine the effects of changing process recipe parameters, is beneficial for facilitating process improvement.

FIG. 6 illustrates one embodiment of a method, however, other embodiments are also contemplated. For example, in another embodiment, block 610 may follow block 620. In another embodiment, blocks 610, 615, and 620 may be repeated one or more times after a first iteration of method 600.

The disclosed method is highly repeatable at different processing conditions and can be used to characterize plasma behavior with greater confidence than conventional approaches. From the plasma behavior, the process conditions may be adjusted at block 620 by the controller 180 in response to the at least one plasma parameter determined at block 615. In one example, the at least one plasma parameter may include one or more of sheath position or sheath thickness, among other parameters. The adjustment in process conditions may include at least one of—change in at least one of an amount of gas provided to the processing region, the gas mixture provided to the processing region, a pressure within the processing chamber, power applied for coupling to plasma, bias power, spacing between the substrate and the showerhead, frequency of power applied for coupling to plasma, or other processing parameter.

As an additional benefit of the disclosure, captured images may also be indicative of where particles may fall out of the plasma and create defects on a substrate. For example, images may be indicative of locations in the plasma 330 where particles 400 are concentrated, due to non-uniform plasma density or non-uniform plasma potential. Identification of such non-uniformities using methods disclosed herein facilitates correction the non-uniformities, resulting in more uniform particle concentration per unit area of substrate, for example, within limits that do not adversely affect device performance.

In some examples described herein, the first set of captured images and the second set of captured images are used to determine the effect of changes in process conditions or process recipe parameters. Additional captured images may be obtained and compared to previous captured images to iteratively adjust process conditions to reach a desired outcome. In another example the first set captured images may include a reference image of a known plasma characteristic or behavior. In such an example, the second set of captured images may be compared to the reference image(s) to obtain a desired plasma characteristic. This process may be performed over multiple iterations.

In another example, the first set of images capture a plasma termination in a process chamber over a substrate. Because of the direction of plasma termination (e.g., center-to-edge or edge-to-center), some portions of the substrate may be exposed to the plasma longer than other portions of the substrate. For example, in an edge-to-center termination, the center portion of the substrate is exposed to the plasma for a longer period of time than the edge portion of the substrate, resulting in uneven processing of the substrate. Using the captured images, the uneven processing can be identified, and corrected by adjustment of processing conditions. Subsequent captured images can confirm improvement of due to processing condition adjustment. As noted, process conditions to affect plasma termination and/or position include gas flow rate, chamber pressure, power application, electrode spacing relative to another electrode or to the substrate, amongst others.

The terms "characteristic" and "behavior" when referring to plasma are intended to encompass properties of plasma, including those described herein. It is noted that "characteristic" and "behavior" may overlap in definition, and may be used interchangeably herein, unless explicitly stated otherwise.

While the foregoing is directed to particular embodiments of the present disclosure, it is to be understood that these embodiments are merely illustrative of the principles and applications of the present invention. It is therefore to be understood that numerous modifications may be made to the illustrative embodiments to arrive at other embodiments without departing from the spirit and scope of the present inventions, as defined by the appended claims.

What is claimed is:

1. A method for monitoring plasma characteristics in a plasma processing chamber, the method comprising:
    performing a first plasma process in a processing chamber at a first processing condition;
    acquiring at least one image of a first plasma of the first plasma process while extinguishing the plasma;
    determining a plasma parameter of the first plasma based on the at least one image, the determining the plasma parameter comprising determining a termination direction of the first plasma while extinguishing the first plasma;
    modifying the first processing condition to a second processing condition for a second plasma process in response to the determined plasma parameter;
    performing the second plasma process in the processing chamber at the second processing condition, the second processing condition selected such that a second plasma of the second plasma process extinguishes in a center-to-edge direction; and
    extinguishing the second plasma of the second plasma process.

2. The method of claim 1 further comprising:
    acquiring a second image of the plasma under the second processing condition.

3. The method of claim 1, wherein acquiring the at least one image occurs through a first lens placed in an aperture and one of a plurality of gas-passage holes formed on a ring-shaped liner disposed within the processing chamber.

4. The method of claim 3, wherein the first lens placed in the aperture is a wide angle lens with a focal length of about 5 mm to about 6 mm.

5. The method of claim 3, wherein acquiring the at least one image further comprises:
    observing the plasma through a viewport formed in the processing chamber, the viewport coupled to the aperture and aligned with the first lens.

6. The method of claim 5, wherein observing the plasma through the viewport further comprises:
    viewing the plasma through at least one additional lens aligned with the first lens.

7. The method of claim 3, wherein acquiring the at least one image further comprises:
    capturing images of the plasma with a camera, a first lens of the camera aligned with the first lens placed in the aperture.

8. The method of claim 7, wherein the camera has an image capture rate of at least 50,000 frames per second.

9. A method for monitoring plasma characteristics in a plasma processing chamber, the method comprising:
    performing a first plasma process in a processing chamber at a first processing condition;
    acquiring at least one image of a first plasma of the first plasma process while extinguishing the plasma, the acquiring occurring through a first lens placed on an aperture coupled to one of a plurality of gas-passage holes formed on a ring-shaped liner disposed within the processing chamber;
    determining a plasma parameter of the first plasma based on the at least one image, the determining the plasma parameter comprising determining a termination direction of the first plasma while extinguishing the first plasma;
    modifying the first processing condition to a second processing condition for a second plasma process in response to the determined plasma parameter;
    performing the second plasma process in the processing chamber at the second processing condition, the second processing condition selected such that a second plasma of the second plasma process extinguishes in a center-to-edge direction; and
    extinguishing the second plasma of the second plasma process.

10. A method for monitoring plasma characteristics in a plasma processing chamber, the method comprising:
    performing a first plasma process in a processing chamber at a first processing condition;
    acquiring a plurality of images capturing a collapse and termination of a first plasma of the first plasma process;
    determining a plasma parameter of the first plasma based on at least one of the plurality of images, the determining the plasma parameter comprising determining a termination direction of the first plasma while extinguishing the first plasma;
    modifying the first processing condition to a second processing condition for a second plasma process in response to the determined plasma parameter;
    performing the second plasma process in the processing chamber at the second processing condition, the second processing condition selected such that a second plasma of the second plasma process extinguishes in a center-to-edge direction; and
    extinguishing the second plasma of the second plasma process.

* * * * *